United States Patent
Ghosh et al.

(10) Patent No.: US 9,685,210 B1
(45) Date of Patent: Jun. 20, 2017

(54) OVERLAPPING PRECHARGE AND DATA WRITE

(71) Applicant: QUALCOMM Incorporated, San Diego, CA (US)

(72) Inventors: Sonia Ghosh, San Diego, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/205,857

(22) Filed: Jul. 8, 2016

(51) Int. Cl.
- G11C 7/12 (2006.01)
- G11C 11/419 (2006.01)
- G11C 7/06 (2006.01)
- G06F 12/00 (2006.01)

(52) U.S. Cl.
CPC .............. *G11C 7/12* (2013.01); *G06F 12/00* (2013.01); *G11C 7/06* (2013.01); *G11C 11/419* (2013.01)

(58) Field of Classification Search
CPC .................................. G11C 7/12; G11C 7/06
See application file for complete search history.

(56) References Cited

U.S. PATENT DOCUMENTS

| | | | |
|---|---|---|---|
| 6,567,314 B1 | 5/2003 | Ogura et al. | |
| 6,882,562 B2 | 4/2005 | Beucler | |
| 7,254,088 B2 | 8/2007 | Kurumada et al. | |
| 9,064,556 B2 | 6/2015 | Gulati et al. | |
| 2003/0112686 A1* | 6/2003 | Gutwin | G11C 11/406 365/222 |
| 2008/0183984 A1 | 7/2008 | Beucler et al. | |
| 2010/0232221 A1* | 9/2010 | Park | G11C 11/5642 365/185.03 |
| 2013/0132685 A1* | 5/2013 | Vogelsang | G06F 12/00 711/154 |
| 2014/0185367 A1* | 7/2014 | Ngo | G11C 11/419 365/154 |
| 2015/0109865 A1* | 4/2015 | Gulati | G11C 7/12 365/189.02 |

* cited by examiner

*Primary Examiner* — Harry W Byrne
*Assistant Examiner* — Ajay Ojha
(74) *Attorney, Agent, or Firm* — Arent Fox, LLP and Qualcomm, Incorporated (57) ABSTRACT

A memory includes a plurality of memory cells and a plurality of bitlines. Each of the plurality of bitlines is coupled to a corresponding one of the plurality of memory cells. A precharge circuit precharges each of the plurality of bitlines before a read operation and precharges all but one of the plurality of bitlines following the read operation. A write driver drives the one of the plurality of bitlines following the read operation. A method includes precharging each of a plurality of bitlines before a read operation. Each of the plurality of bitlines is coupled to a corresponding one of a plurality of memory cells. The method further includes precharging all but one of the plurality of bitlines following the read operation and driving the one of the plurality of bitlines following the read operation.

23 Claims, 10 Drawing Sheets

OVERLAPPING PRECHARGE AND DATA WRITE

BACKGROUND

Field

The present disclosure relates generally to memory circuits, and more particularly, to a memory with an improved precharge and data write scheme.

Background

Memory is a vital component for wireless communication devices (e.g., integrated as part of an application processor in a cell phone). Many of the wireless applications depend on the functionality of a dual port memory, e.g., a memory capable of handling both a read and a write operation within a single clock cycle. A dual port memory typically includes two ports operating with an array of memory cells, which may be simultaneously accessed from both ports. For example, a dual port memory may access two different memory locations (addresses) in a single cycle. In order to reduce the size of the memory, a pseudo-dual port or PDP memory may be used in place of the dual port memory. The core of the PDP memory may be a single-core memory. Accordingly, the memory array of the PDP memory may allow for a single memory access at one instance and not two simultaneous memory accesses as with the dual port memory. The PDP memory may have two ports to emulate the dual port memory. The PDP memory may sequentially perform a read operation and then a write operation to satisfy the dual port function.

With the ever increasing demands for more processing capability, one design challenge is to improve the performance of the PDP memory. For example, reducing the cycle time of the PDP memory may allow the PDP memory to be used by more applications.

SUMMARY

Aspects of a memory are disclosed. In one implementation, the memory includes a plurality of memory cells and a plurality of bitlines. Each of the plurality of bitlines is coupled to a corresponding one of the plurality of memory cells. A precharge circuit is configured to precharge each of the plurality of bitlines before a read operation and to precharge all but one of the plurality of bitlines following the read operation. A write driver is configured to drive the one of the plurality of bitlines following the read operation.

Aspects of a method for operating a memory are disclosed. In one implementation, the method includes precharging each of a plurality of bitlines before a read operation. Each of the plurality of bitlines is coupled to a corresponding one of a plurality of memory cells. The method further includes performing the read operation, precharging all but one of the plurality of bitlines following the read operation, and driving, by a write driver, the one of the plurality of bitlines following the read operation.

Further aspects of a memory are disclosed. In one implementation, the memory includes a plurality of memory cells and a plurality of bitlines. Each of the plurality of bitlines is coupled to a corresponding one of the plurality of memory cells. A precharge circuit is configured to precharge all of the plurality of bitlines for a first operation and to precharge all but one of the plurality of bitlines for a second operation.

Further aspects of a memory are disclosed. In one implementation, the memory includes a plurality of memory cells and a plurality of bitlines. Each of the plurality of bitlines is coupled to a corresponding one of the plurality of memory cells. A precharge circuit is configured to precharge the plurality of bitlines. A write driver is configured to drive the plurality of bitlines. A controller is configured to enable a portion of the precharge circuit and the write driver to overlap.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of the disclosure will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system. Various apparatus and methods presented throughout this disclosure may be implemented in various forms of hardware. By way of example, any of the apparatus or methods, either alone or in combination, may be implemented as an integrated circuit, or as part of an integrated circuit. The integrated circuit may be an end product, such as a microprocessor, a digital signal processor (DSP), an application specific integrated circuit (ASIC), programmable logic, or any other suitable integrated circuit. Alternatively, the integrated circuit may be integrated with other chips, discrete circuit elements, and/or other components as part of either an intermediate product, such as a motherboard, or an end product.

The methods disclosed herein comprise one or more operations or actions for achieving the described method. The method operations and/or actions may be interchanged with one another without departing from the scope of the claims. In other words, unless a specific order of operations or actions is specified, the order and/or use of specific operations and/or actions may be modified without departing from the scope of the claims.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of the elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory will now be presented in the context of a static random access memory (SRAM) configured as a PDP memory. SRAM is volatile memory that requires power to retain data. However, as those skilled in the art will readily appreciate, such aspects may be extended to other memories and/or circuit configurations. Accordingly, all references to the SRAM and the PDP memory are intended only to illustrate exemplary aspects of the memory with the understanding that such aspects may be extended to a wide range of applications.

Figure 1:
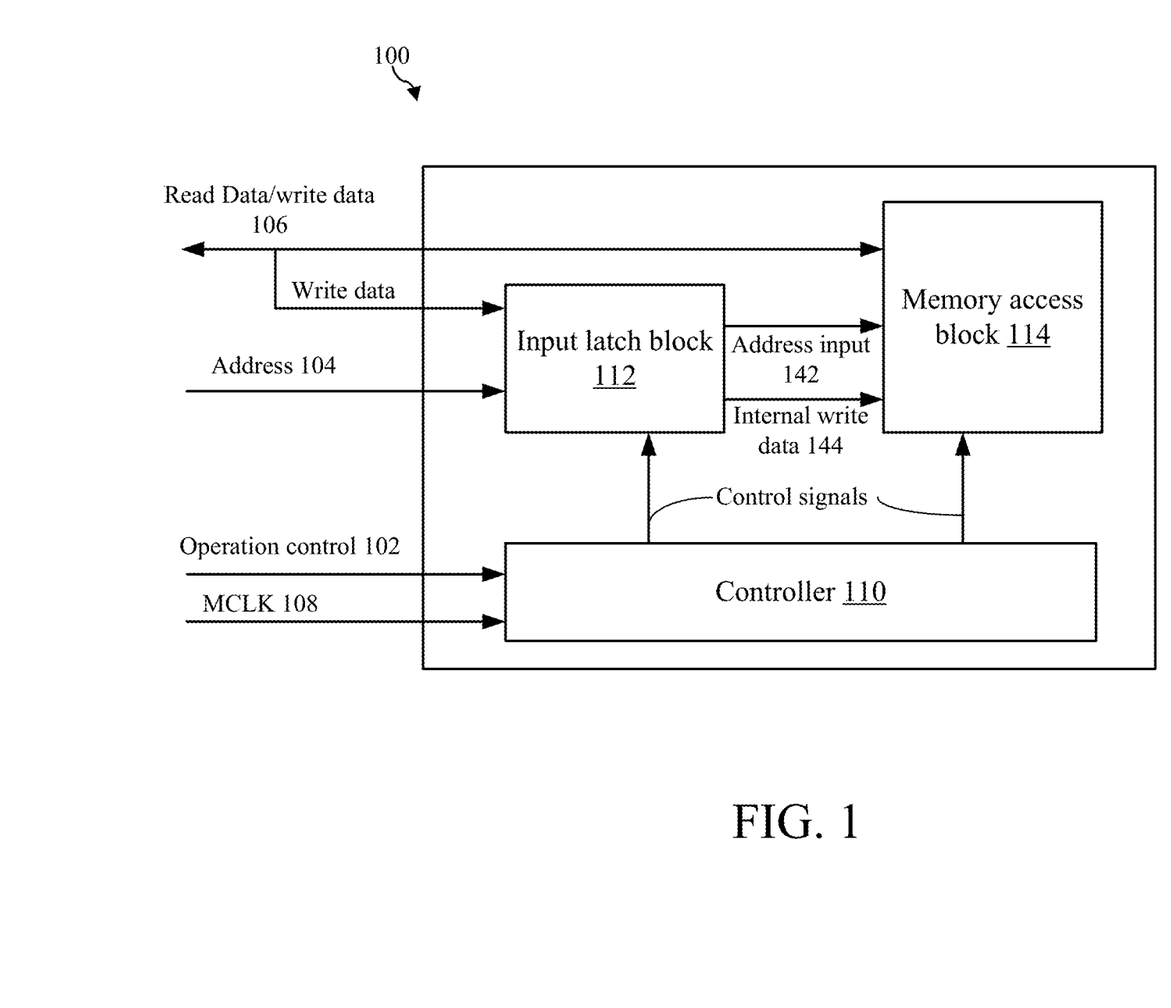
FIG. 1 is a block diagram of an embodiment of a memory.

FIG. 1 is a block diagram of an exemplary embodiment of a memory 100. The memory 100 provides a medium for peripheral circuits (external to the memory 100) to write and read data (e.g., program instructions and data operated by the instruction). As used hereinafter, the term "data" will be understood to include program instructions, data, and any other information that may be stored in the memory 100. In one implementation, the memory 100 may be arranged as a PDP memory executing sequentially a read operation and then a write operation. The memory 100 includes an input latch block 112, a memory access block 114, and a controller 110.

The input latch block 112 interfaces and latches the address 104 and outputs the address input 142 to the memory access block 114 (e.g., as the read address and/or the write address to access the memory). The input latch block 112 may in addition receive and latch the write data (e.g., from read data/write data 106). The latched write data may be provided to the memory access block 114 as the internal write data 144. The memory access block 114 decodes the address input 142 to access the memory cells for read and write operations. The memory access block 114 outputs the read data on the read data/write data 106.

The controller 110 receives the operation control 102 and the master clock MCLK 108 to control the operations of the memory 100. The controller 110, based on the operation control 102, provides various control signals to the input latch block 112 and the memory access block 114 to direct the memory 100 to operate in various operating modes. For example, the memory 100 may perform read, write, or various testing operations as directed by the controller 110. The master clock initiates the control signals to operate the memory operations.

The controller 110 and the portions of the controller 110 presented herein may be presented in terms of the functions and signals generated by the controller 110. The functions and signal generation may be implemented using electronic hardware (e.g., logic gates and circuits), computer software, or any combination thereof. Whether such elements are implemented as hardware or software depends upon the particular application and design constraints imposed on the overall system.

Figure 2:
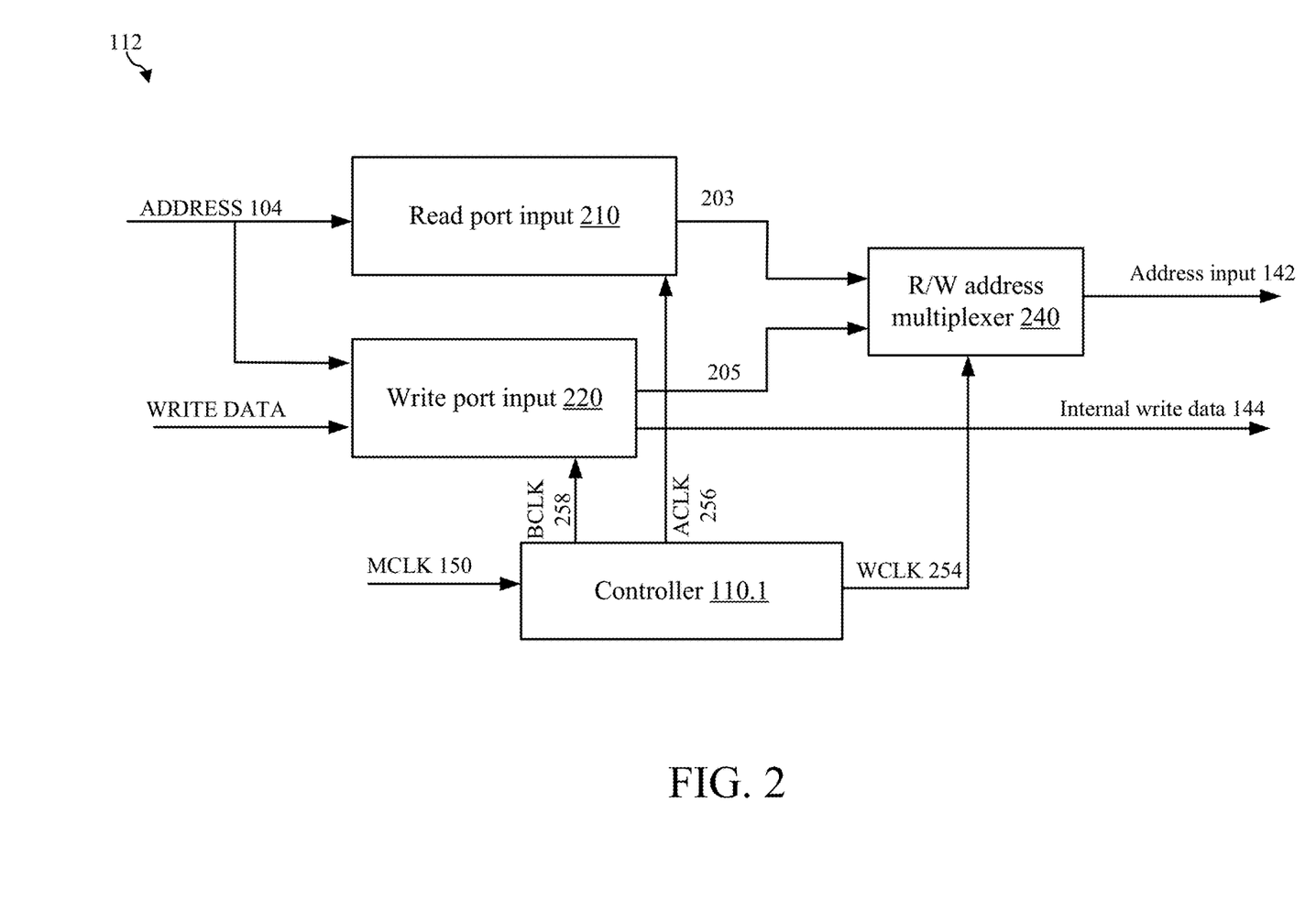
FIG. 2 is a block diagram of an input latch block of the memory of FIG. 1.

FIG. 2 is a block diagram of an input latch block of the memory of FIG. 1. The input latch block 112 includes a read port input circuit 210 configured to receive and latch the address 104 and a write port input circuit 220 configured to receive and latch the address 104 and the write data (from the read data/write data 106). A portion of the controller (controller portion) 110.1 receives a master clock MCLK 150, which initiates the memory access cycle. The controller portion 110.1 may include logic to perform the functions described herein, processor(s) performing the functions, logic gates generating the signals described herein, or combinations thereof. In one example, the memory 100 may perform a read memory access and then a write memory access in one access cycle set forth by the MCLK 150. Based on the MCLK 150, the controller portion 110.1 generates the clock signal ACLK 256, which enables the read port input circuit 210 to receive and latch the address 104 for the read operation, and the clock signal BCLK 258, which enables the write port input circuit 220 to receive and latch the address 104 and the write data for the write operation.

The read port input circuit 210 outputs the received address 104 as the internal read address 203. The write port input circuit 220 outputs the received address 104 as the internal write address 205 and the received write data as the internal write data 144. The internal read address 203 (stored by the read port input circuit 210) and the internal write address 205 (stored by the write port input circuit 220) are provided to the read/write (R/W) address multiplexer 140. The controller portion 110.1 generates a clock WCLK 254 for the R/W address multiplexer 240 to select among the internal read address 203 and the internal write address 205 (for the read operation and the write operation, respectively). The selected address is output as the address input 142 to the memory access block 114 of the memory 100. Likewise, the internal write data 144 is provided to the memory access block 114 of the memory 100 as selected by the WCLK 254. In other words, the controller portion 110.1 generates the WCLK 254 to switch between the read address to the write address for the memory access.

Figure 3:
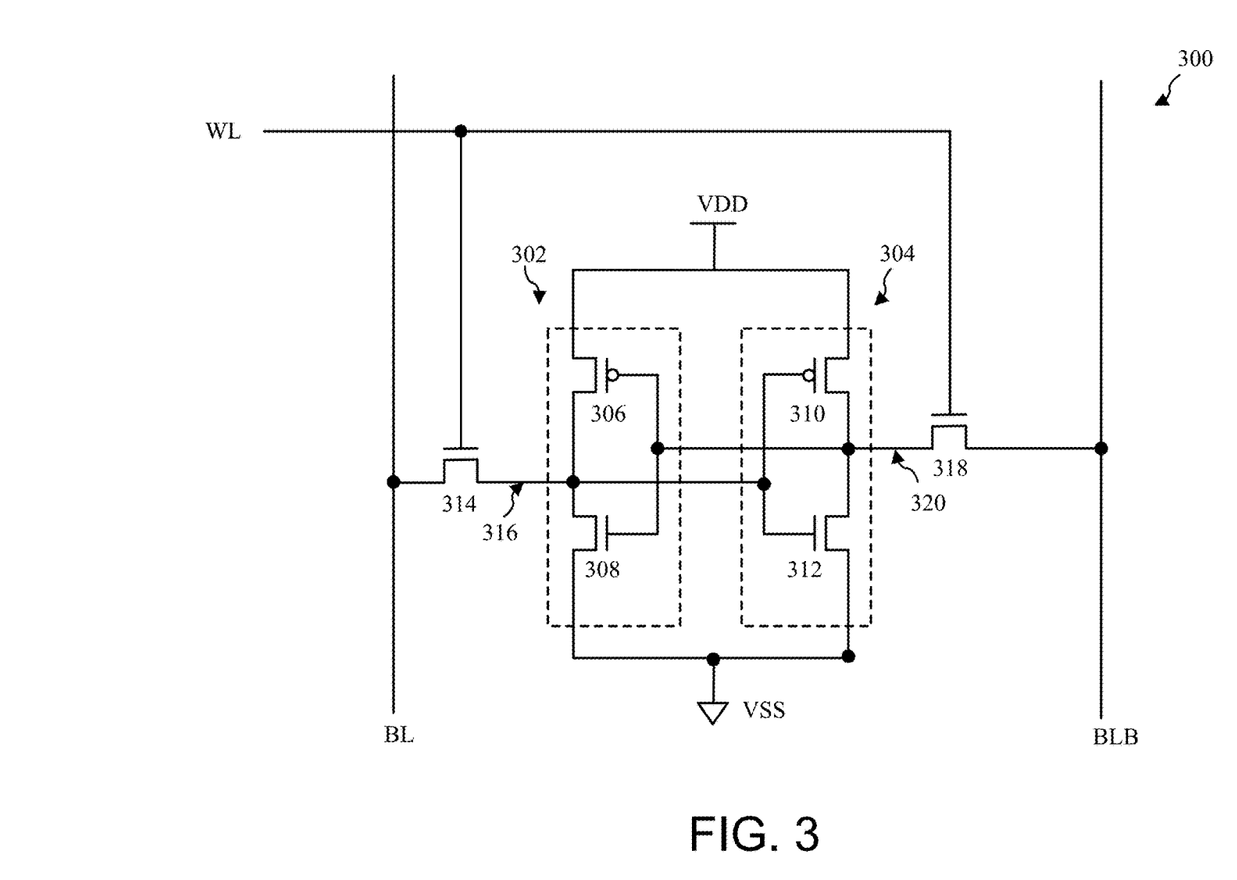
FIG. 3 is a circuit diagram of an embodiment of a memory cell of the memory of FIG. 1.

The memory 100 may be any suitable memory technology, such as, by way of example, an SRAM. However, as those skilled in the art will readily appreciate, the memory 100 is not necessarily limited to SRAM. An SRAM includes an array of storage elements know as "cells," "memory cells," or "bitcells." Each memory cell is configured to store one bit of data (e.g., a logic 1 or a logic 0). FIG. 3 is a circuit diagram of an exemplary embodiment of a memory cell of the memory of FIG. 1. The memory cell 300 may be implemented with a six-transistor (6T) configuration. However, as those skilled in the art will readily appreciate, the cell may be implemented with a four-transistor (4T) or any other suitable transistor configuration.

The memory cell 300 is shown with two inverters 302, 304. The first inverter 302 includes a p-channel transistor 306 and an n-channel transistor 308. The second inverter 304 includes a p-channel transistor 310 and an n-channel transistor 312. In the described embodiment, the inverters 302 and 304 are powered by VDD and have a return VSS (e.g., ground). The first and second inverters 302, 304 are interconnected to form a cross-coupled latch. A first n-channel access transistor 314 couples the output node 316 from the first inverter 302 to a bitline BL, and a second n-channel access transistor 318 couples the output node 320 from the second inverter 304 to a bitline BLB (the value of which is the opposite or inverse of the bitline BL). The gates of the access transistors 314, 318 are coupled to a wordline WL.

A read operation may be initiated by precharging or charging the bitlines BL and BLB to a predetermined level, which is determined so as not to disturb the stored data in the memory cell 300. In some examples, the precharge circuit BLPC 412 (see FIGS. 4 and 5) precharges or pulls up the bitlines BL and BLB to a predetermined level that does not flip the stored data. The predetermined level may be a high level or VDD. In some examples, the predetermined level may be a portion (e.g., half) of VDD. The wordline WL then is asserted, connecting the cross-coupled inverters 302, 304 to the bitlines BL and BLB via the access transistors 314 and 318, respectively. By way of example, the memory cell 300 may store the logic 1 by storing a low level (e.g., ground) at the output node 316 and a high level (e.g., VDD) at the output node 320. The states are maintained by the cross-coupled inverters 302, 304. Upon asserting the wordline WL, the inverter 302 discharges the bitline BL through the access transistor 314 and the output node 316. The bitline BLB is maintained at the high level by the inverter 304 through the access transistor 318 and the output node 320. A voltage difference on the bitline pair BL and BLB is thus established by the pulling-down of the bitline BL.

The bitlines BL and BLB are fed to a sense amplifier (SA), which senses the data (e.g., voltage difference or differential voltage) carried thereon and outputs a logic level (e.g., logic 1) as the read data to the peripheral circuit external to the memory 100. Various types of SAs known in the art may be utilized for the memory 100.

A write operation may be initiated by setting the bitlines BL and BLB to the value to be written to the memory cell 300 and asserting the wordline WL. That is, the internal write data 144 are driven onto the bitlines BL and BLB. The wordline WL may be asserted before or after the value to be written (e.g., internal write data 144) is provided to the bitlines BL and BLB. By way of example, a logic 1 may be written to the memory cell 300 by setting the bitline BL to a logic level 0 and the bitline BLB to a logic 1. The logic level 0 at the bitline BL is applied to the input of the second inverter 304 through the access transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level 0 may be written to the memory cell 300 by inverting the values of the bitlines BL and BLB. The write driver is designed to be stronger than the pull-up transistors (306 and 310) in the memory cell 300 so that the internal write data 144 can override the previous state of the cross-coupled inverters 302, 304.

Once the read or write operation is complete, the wordline is de-asserted, thereby causing the access transistors 314 and 318 to disconnect the bitlines BL and BLB from the two inverters 302, 304. The cross-coupling between the two inverters 302, 304 maintains the state of the inverter outputs as long as power is applied to the memory cell 300.

Figure 4:
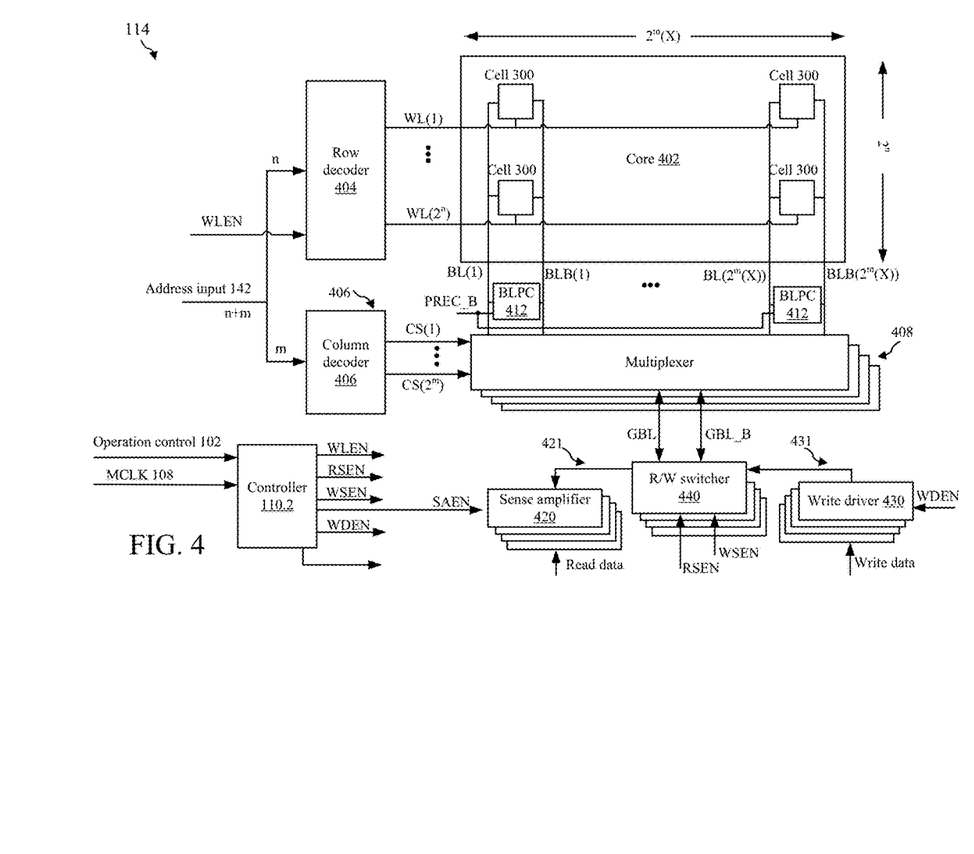
FIG. 4 is a block diagram of an embodiment of a memory access block of the memory of FIG. 1.

FIG. 4 is a block diagram of an exemplary embodiment of a memory access block of the memory of FIG. 1. The memory access block 114 includes a core 402 with supporting circuitry to decode addresses and to perform read and write operations. The core 402 includes memory cells 300 arranged to share connections in horizontal rows and vertical columns. Specifically, each horizontal row of memory cells 300 shares a wordline WL and each vertical column of memory cells 300 shares a pair of bitlines BL and BLB. The size of the core 402 (i.e., the number of cells) may vary depending on a variety of factors, including the specific application, the speed requirements, the layout and testing requirements, and the overall design constraints imposed on the system. The core 402 may contain thousands or millions of memory cells.

In one implementation, the core 402 is made up of $(2^n \times 2^m(x))$ memory cells 300 arranged in $2^n$ horizontal rows and $2^m(x)$ vertical columns, where $2^m$ is the number of words per row and x is the number of bits in each word outputted for a read access. A peripheral device (not shown) may randomly access any word (i.e., x cells) in the core 402 using an address that is (n+m) bits wide. In other words, the memory 100 outputs x-bits of read data for a read operation, and writes x-bits of data (internal write data 144) into the core 402 for a write operation.

The memory access block 114 receives the address input 142 of (n+m) bits from the input latch block 112. The address input 142 may include n-bit row address and m-bit column address. In the memory access block 114, n-bits of the address are provided to the input of a row decoder 404 and m-bits of the address are provided to the input of a column decoder 406. The row decoder 404 converts the n-bit address into $2^n$ wordline outputs. A different wordline WL is asserted by the row decoder 404 for each different n-bit row address. As a result, each of the $2^m(x)$ memory cells 300 in the horizontal row with the asserted wordline WL is connected to one pair of the $2^m(x)$ bitlines BL and BLB through the access transistors 314 and 318 as described above in connection with FIG. 3. The data stored in the memory cells are provided to the BL_RD and BLB_RD bitline pairs through the selected pairs of bitlines BL and BLB and the x multiplexers 408 with the asserted wordline WL, as described with FIG. 3. The BL_RD and BLB_RD bitline pairs are provided to the SAs 420 for amplification, and the resulting data of the amplification are output as read data.

In some examples, the row decoder 404 may be enabled or disabled (e.g., timed) by the signal WLEN. When the WLEN signal is de-asserted, the row decoder 404 does not assert any wordline. In this fashion, the WLEN signal may control a period and timing of asserting a wordline WL.

For column decoding, the memory access block 114 provides m bits of address to the column decoder 306. The column decoder 306 provides 2m outputs column selects (CS(1)–CS(2m)) with a different one of the outputs asserted for each different combination of address inputs. The outputs are provided to x multiplexers 408. By way of example, the multiplexers 408 may include passgates. Each multiplexer may be a 2m:1 multiplexer and selects one of 2m bitline pairs read from the memory array [core] 402 based on the outputs from the column decoder 306. With x multiplexers 408, x bits are selected and outputted for each read access. Thus, for each memory access, x-bit of data are read from or written into the core 402. In some examples, the multiplexers 408 may be viewed as a 2m:1 selector. The selected x bitline pairs are outputted to SAs 420 as bitline pairs GBL and GBL_B.

The GBL and GBL_B bitline pairs are coupled to SAs 420 and write drivers 430 via the read/write switcher 440. The RSEN and WSEN signals control the read/write switcher 440. In a read operation, the RSEN signal is asserted, and the WSEN signal is de-asserted. In response, the read/write switcher 440 couples the GBL and GBL_B bitline pairs to the SAs 420. The SAEN signal, when asserted, enables the SAs 420 to read out the data on the GBL and GBL_B bitline pairs as read data (e.g., the read data/write data 106).

Upon switching to the write operation, the RSEN signal is de-asserted, and the WSEN signal is asserted. In response, the read/write switcher 440 couples the GBL and GBL_B bitline pairs to the write drivers 430. The WDEN signal, when asserted, enables the write drivers 430 to write the internal write data 144 into the GBL and GBL_B bitline pairs.

The controller portion 110.2 receives the operation control 102 (e.g., to indicate a read or write operation) and the MCLK clock. The controller portion 110.2 may generate the signals WLEN, RSEN, WSEN, SAEN, and WDEN as presented above using known schemes and circuits. For example, a dummy wordline may be include and relied upon to time the asserting of the WLEN signal. A dummy bitline may be included and relied upon to time the asserting of the SAEN signal.

Figure 5:
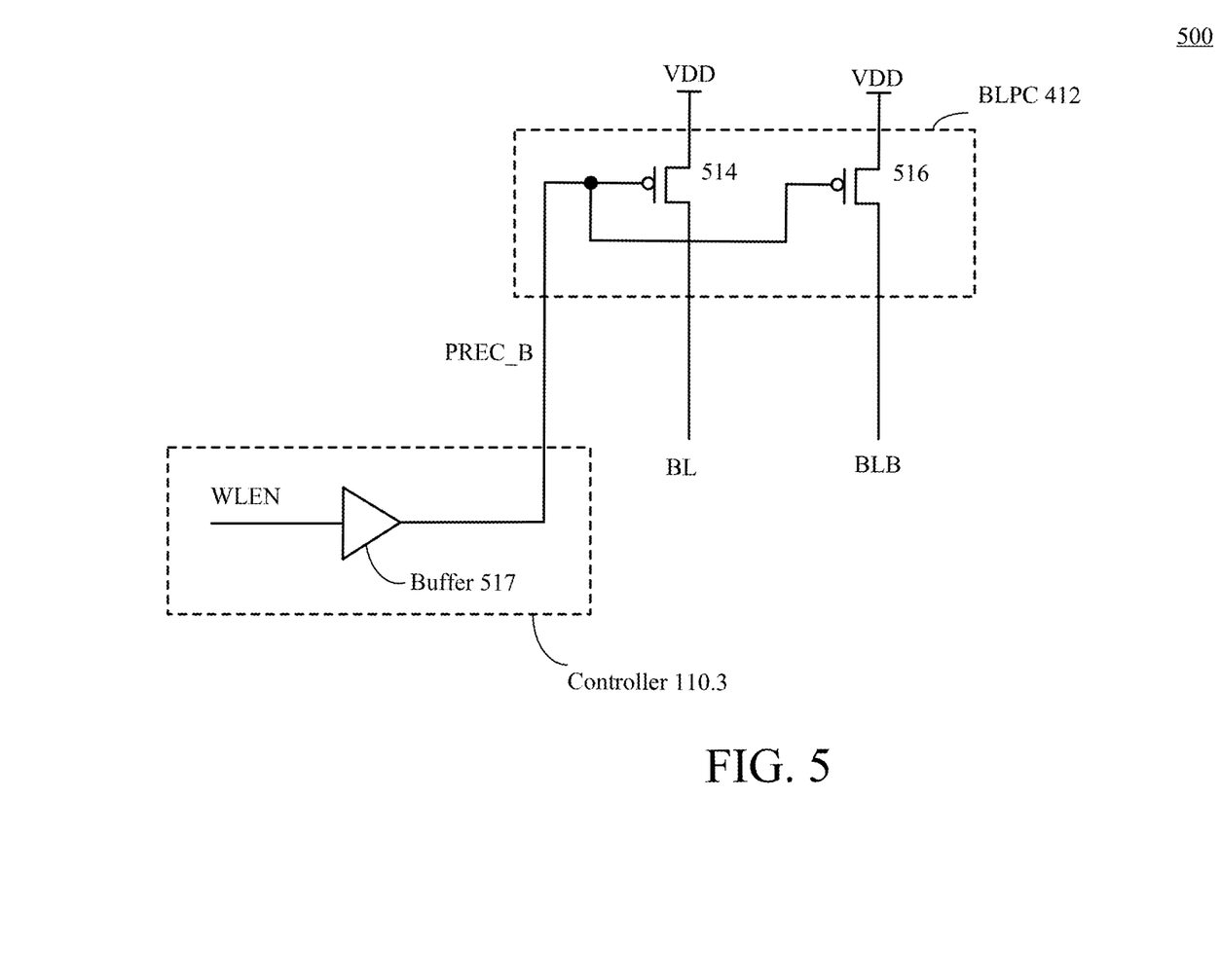
FIG. 5 is a circuit diagram of an embodiment of a bitline precharge circuit and the associated portion of a controller.

FIG. 5 is a circuit diagram of an exemplary embodiment of a bitline precharge circuit and the associated portion of a controller. The diagram 500 includes the BLPC 412 and the controller portion 110.3. The BLPC 412 is configured to precharge or pull up the bitline pair BL and BLB when the wordlines WL are de-asserted (e.g., when the memory 100 is not in a read or write operation). In one implementation, the BLPCs 412 are configured to charge all of the bitline pairs BL and BLB coupled to the core 402. The BLPC 412 includes p-type transistors 514 and 516 controlled by the PREC_B signal.

The controller portion 110.3 receives the WLEN signal and, in response, outputs the PREC_B signal. The controller portion 110.3 may de-assert the WLEN signal (e.g., pull to low level) to de-assert the wordlines WL upon a completion of a read operation. The controller portion 110.3 includes the buffer 517. The buffer 517 receives the WLEN signal and outputs the PREC_B signal to the BLPCs 412. Thus, in response to the controller 110 de-asserting the WLEN signal, the PREC_B signal is asserted (e.g., pulled to low level) to turn on the p-type transistors 514 and 516 to precharge the bitline pair BL and BLB.

Figure 6:
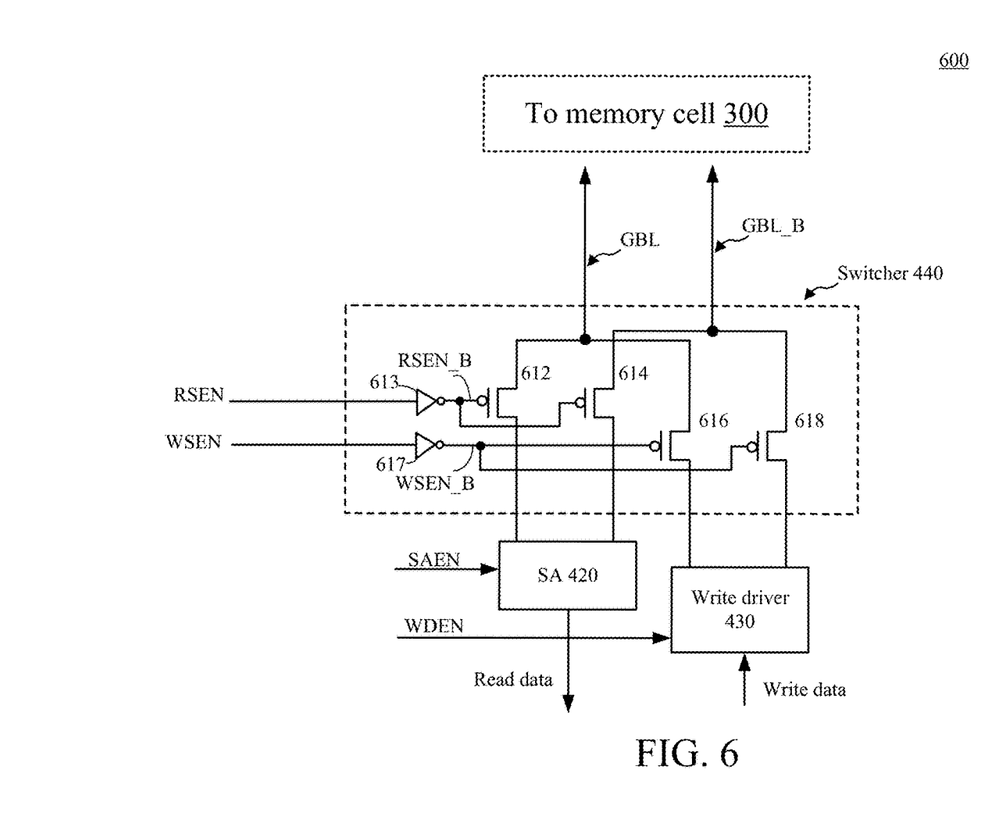
FIG. 6 is a circuit diagram of an embodiment of a read/write switcher and the associated sense amplifier and write driver.

FIG. 6 is a circuit diagram of an exemplary embodiment of a read/write switcher and the associated sense amplifier and write driver. The circuit diagram 600 illustrates one read/write switcher 440 controlled by signals RSEN and WSEN and the associated SA 420 (controlled by signal SAEN) and the write driver (controlled by the signal WDEN). The read/write switcher 440 provides the means to switch the memory cell 300 coupling to the SA 420 and to the write driver 430. The read/write switcher 440 includes p-type transistors 612 and 614 coupling the bitline pair GBL and GBL_B (which is coupled to the memory cell 300) to the SA 420. The transistors 612 and 614 are controlled by the signal RSEN, via the inverter 613. The inverter 613 receives the RSEN signal and outputs the RSEN_B signal (inverse the state of the RSEN signal) to control the transistors 612 and 614. The read/write switcher 440 further includes p-type transistors 616 and 618 coupling the bitline pair GBL and GBL_B (which is coupled to the memory cell 300) to the write driver 430. The transistors 616 and 618 are controlled by the signal WSEN via the inverter 617. The inverter 617 receives the WSEN signal and outputs the WSEN_B signal (inverse the state of the WSEN signal) to control the transistors 616 and 618.

In a case the signal RSEN is asserted and the signal WSEN is de-asserted, the transistors 612 and 614 are turned on to couple or connect the SA 420 to the bitline pair GBL and GBL_B (and therefore to the memory cell 300). The SA 420 may accordingly sense the read data stored in the memory cell 300 (via the bitline pair BL and BLB coupled to the bitline pair GBL and GBLB). The transistors 616 and 618 are turned off to decouple or disconnect the write driver 430 from the bitline pair GBL and GBL_B (and therefore the memory cell 300). In a case the signal RSEN is de-asserted and the signal WSEN is asserted, the transistors 616 and 618 are turned on to couple or connect the write driver 430 to the bitline pair GBL and GBL_B (and therefore to the memory cell 300). The write driver 430 may accordingly drive or write the internal write data 144 into the memory cell 300 (via the bitline pair BL and BLB coupled to the bitline pair GBL and GBLB). The transistors 612 and 614 are turned off to decouple or disconnect the SA 420 from the bitline pair GBL and GBL_B (and therefore from the memory cell 300).

As described above, the read/write switcher 440 is controlled by RSEN and

WSEN signals to selectively couple the bitline pair GBL and GBL_B (and therefore the memory cell 300) to the SA 420 or the write driver 430 via the bitline pair BL and BLB. The SA 420 and the write driver 430 may be implemented with schemes known in the art. The read operation and the write operation via the circuits of FIGS. 5 and 6 are presented in reference to FIG. 7 below.

Figure 7:
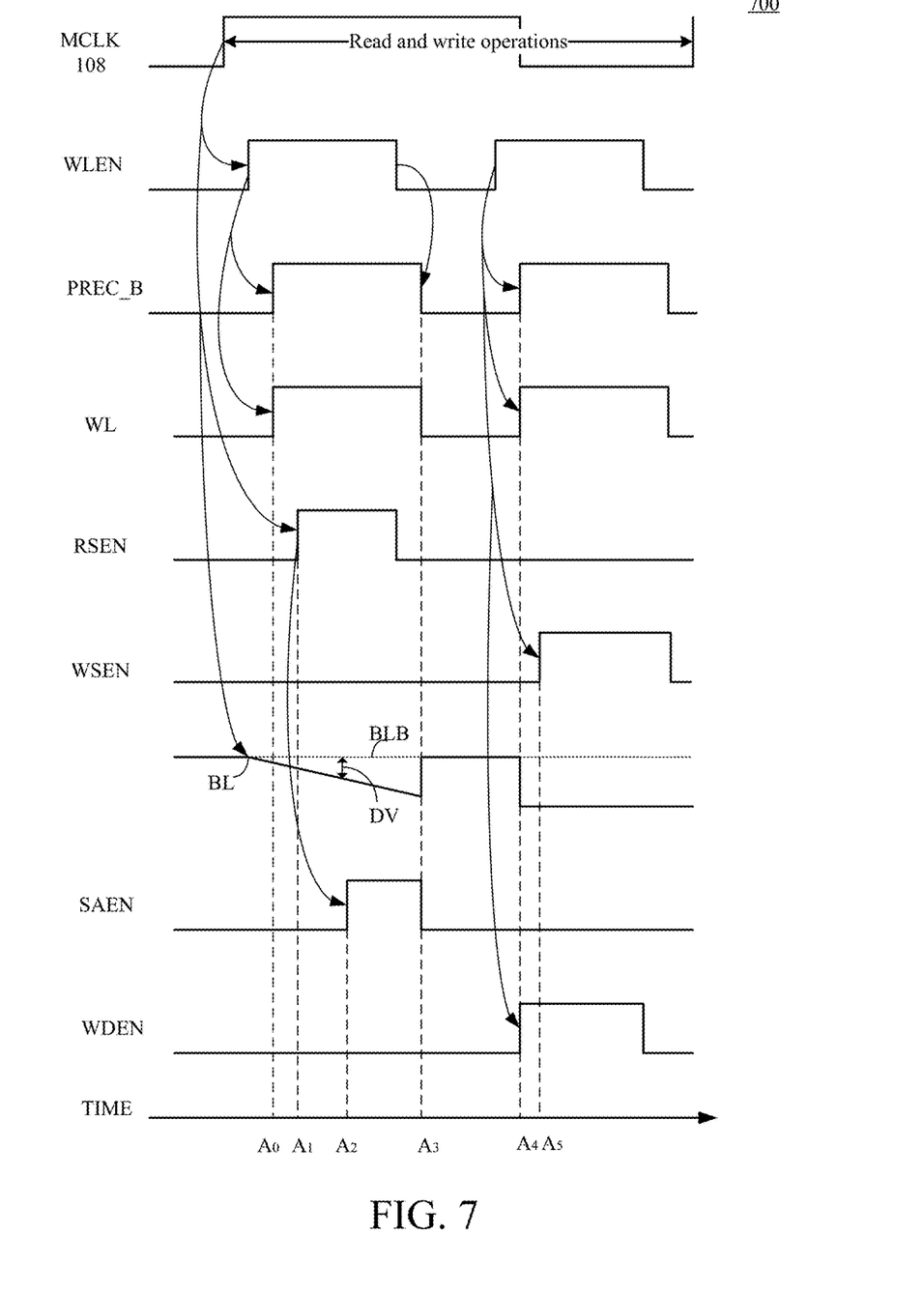
FIG. 7 is a diagram of waveforms of a read operation followed by a write operation for an embodiment of the memory of FIG. 1.

FIG. 7 is a diagram of waveforms of a read operation followed by a write operation for an exemplary embodiment of the memory of FIG. 1. The diagram 700 may be the waveforms operated by the circuits of FIGS. 4-6. The memory 100 receives the master clock MCLK 108 to initialize the operations. In one implementation, the memory 100 may enact a read operation followed by a write operation within one cycle of the MCLK 108. In the initial state (e.g., before the MCLK 108 is asserted), the WLEN signal is de-asserted (e.g., low level), and the precharge signal PREC_B follows the WLEN signal. That is, the PREC_B signal is asserted (pulled to low level) to enable the BLPC 412 to precharge or pull up the bitline pair BL and BLB to VDD (see FIG. 5). The controller 110 asserts the WLEN signal (pulls to high level) in response to the assertion of the MCLK 108. At time $A_0$, the PREC_B signal is de-asserted (pulled to high level) following the asserted WLEN signal (see, FIG. 5). In response, the BLPC 412 stops precharging the bitline pair BL and BLB.

The wordline WL is asserted (e.g., pulled to a high level) as controlled by the WLEN signal (see, FIG. 4, row decoder 404). As presented with FIGS. 3 and 4, for example, a logic 1 is stored in the memory cell 300 by storing a low level (e.g., ground) at the output node 316 and a high level (e.g., VDD) at the output node 320. The asserted wordline WL connects the bitline pair BL and BLB to the memory cell 300, and the bitline BL is pulled down via the access transistor 314 and the output node 316. The bitline BLB remains at VDD, and a differential voltage DV is developed on the bitline pair BL and BLB.

At time $A_1$, the controller 110 (in response to the assertion of the WLEN signal) asserts the RSEN signal for the read operation by pulling the RSEN signal to the high level. The RSEN signal connects the bitline pair GBL and GBLB to the SA 420 (see, FIG. 6). At time $A_2$, a sufficient DV is formed on the bitline pair BL and BLB, and the controller 110 asserts the SAEN signal (e.g., pulls high) to activate the SA 420 to read the DV on the bitline pair BL and BLB (via the bitline pair GBL and GBLB, as presented with FIG. 4). The controller 110 may de-assert the WLEN signal upon a completion of the read operation (e.g., the SAEN signal being de-asserted at time $A_3$).

At time $A_3$, in response to the WLEN signal being de-asserted (and therefore, the wordline WL being de-asserted), the PREC_B signal is asserted (pulled low). In response, the BLPC 412 precharges or pulls high the bitline pair BL and BLB (see FIG. 5). Subsequent to the time $A_3$, the controller 110 may assert the WLEN signal for the write operation (following the read operation). At time $A_4$, the PREC_B signal is de-asserted (pulled to high level) following the asserted WLEN signal (see, FIG. 5). The BLPC 412 stops precharging the bitline pair BL and BLB. The wordline WL is asserted (e.g., pulled to high level) as controlled by the WLEN signal (see, FIG. 4, row decoder 404).

At time $A_5$, the controller 110 may, in response to the asserting the WLEN signal, assert the WSEN signal (e.g., pull to high level). The WSEN signal connects the bitline pair GBL and GBLB to the write driver 430 (see, FIG. 6). The controller 110 may then assert the WDEN signal (e.g., pull to high level) to activate the write driver 430. The write driver 430 drives the internal write data 144 into the memory cell 300 (via the bitline pair GBL and GBLB, the multiplexer 408, and the bitline pair BL and BLB).

In one aspect of the memory 100, the time to assert the WDEN signal (at time $A_5$) follows the bitline precharge time $A_3$-$A_4$. The bitline precharge time $A_3$-$A_4$ may thus be part of the turnaround time for the memory 100 to transition to the write operation. However, the time $A_3$-$A_5$ (for sequential performance of the bitline precharge operation followed by the start of the write driver operation) may degrade the cycle time of the memory 100. Thus, reducing the read/write operation turnaround time of $A_3$-$A_5$ may be advantageous.

Presented herein are exemplary embodiments which utilize overlapping bitline precharge operation and write driver operation to improve the read/write operation turnaround time and therefore, the overall cycle time of the memory 100.

Figure 8:
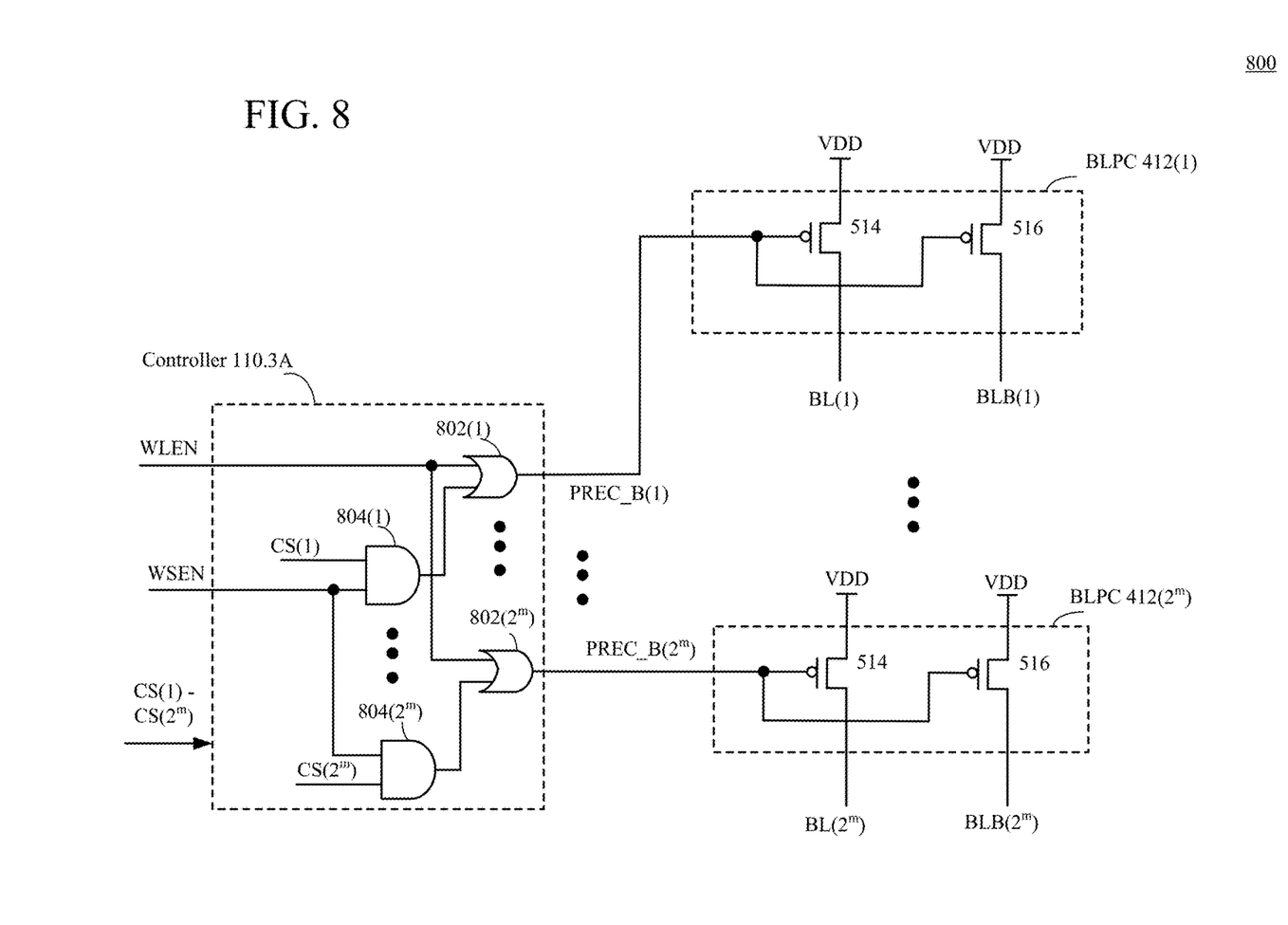
FIG. 8 is a circuit diagram of an embodiment of a bitline precharge circuit and the associated portion of a controller.

FIG. 8 is a circuit diagram of an exemplary embodiment of a bitline precharge circuit and the associated portion of a controller. The diagram 800 includes the BLPCs 412 (BLPC(1)-BLPC($2^m$)) and the controller portion 110.3A. In one aspect, the BLPCs 412 are not controlled by one PREC_B signal, such that the BLPCs 412 do not precharge all of the bitline pairs BL and BLB coupled thereto at one time. The diagram 800 illustrates the BLPCs 412 configured to precharge the bitline pairs BL(1) and BLB(1) to BL($2^m$) and BLB($2^m$). As presented with FIG. 4, the memory 100 may be selected from among $2^m$ words, and each bitline pair represented one of the $2^m$ words. The memory 100 my further include x bit per word, but one bit for each word is shown for clarity.

The controller portion 110.3A provides another exemplary embodiment of the controller portion 110.3 of FIG. 5. The controller portion 110.3A receives the column selects CS(1)-CS($2^m$) from the column decoder 406. The column selects CS(1)-CS($2^m$) are the decoded signals of the m-bit column address, and one of CS(1)-CS($2^m$) may be asserted by the column decoder 406 based on the state of the column address. The controller portion 110.3A further receives the wordline enable signal WLEN and the read/write switch signal WSEN. The controller portion 110.3A outputs the precharge signals PREC_B(1)-PREC_B($2^m$).

For each of the bitline precharge signals PREC_B(1)-PREC_B($2^m$), the corresponding one of the column selects CS(1)-CS($2^m$) is ANDed with the WSEN signal by the corresponding AND gate 804. The output of the AND gate 804 is ORed with the WLEN signal by the corresponding OR gate 802 to generate the precharge signal PREC_B.

In a read cycle or the initial state (prior to the master clock MCLK being asserted), the WSEN signal is de-asserted (since the current mode is not a write operation). In response, the AND gate 804 outputs a logic 0, and the precharge signal PREC_B is asserted (or de-asserted) based on the WLEN signal (as presented with FIG. 5). For example, the precharge signal PREC_B is asserted to precharge or pull up the bitline pair BL and BLB when the WLEN signal is de-asserted (therefore, when the wordline WL is de-asserted).

In response to the operation control 102 inputting a control for write operation, the controller 110 (e.g., the controller portion 110.2) may assert the WSEN signal to set the read/write switcher 440 to couple the bitline pair GBL and GBLB to the write driver 430. Moreover, the controller 110 may assert the WSEN signal to disable the precharge action of the BLPC 412 (presented in further detail below).

The asserted WSEN signal is ANDed with the CS signals (CS(1)-CS($2^m$)). By way of example, the CS(1) is asserted, and the remaining CS signals are de-asserted. The AND gate 804(1), in response to the CS(1) and the WSEN signals being asserted, outputs a logic 1 to the OR gate 802(1). The OR gate 802(1), based on the logic 1 input from the AND gate 804(1), outputs a logic 1 for the precharge signal PREC_B(1), regardless of the states of the WLEN signal. Thus, the precharge action of the BLPC 412(1), which is controlled by the PREC_B(1) signal, is disabled.

The remaining CS(2)-CS($2^m$) signals are de-asserted. In response, the AND gates 804(2)-804($2^m$) (receiving the CS(2)-CS($2^m$) signals) output logic 0 to the OR gates 802(2)-802($2^m$). Accordingly, the OR gates 802(2)-802($2^m$) output the PREC_B(2)-PREC_B($2^m$) signals based on the states of the WLEN signals. As presented above, in one aspect, the BLPC 412(1) may be disabled while the other BLPCs 412 precharge the bitline pairs BL and BLB coupled thereto. The write operation, such as asserting the WDEN signal to enable write driver 430, may be performed on the bitline pair BL(1) and BLB(1) in parallel (e.g., overlap) with the precharge operation at the other bitline pairs.

Figure 9:
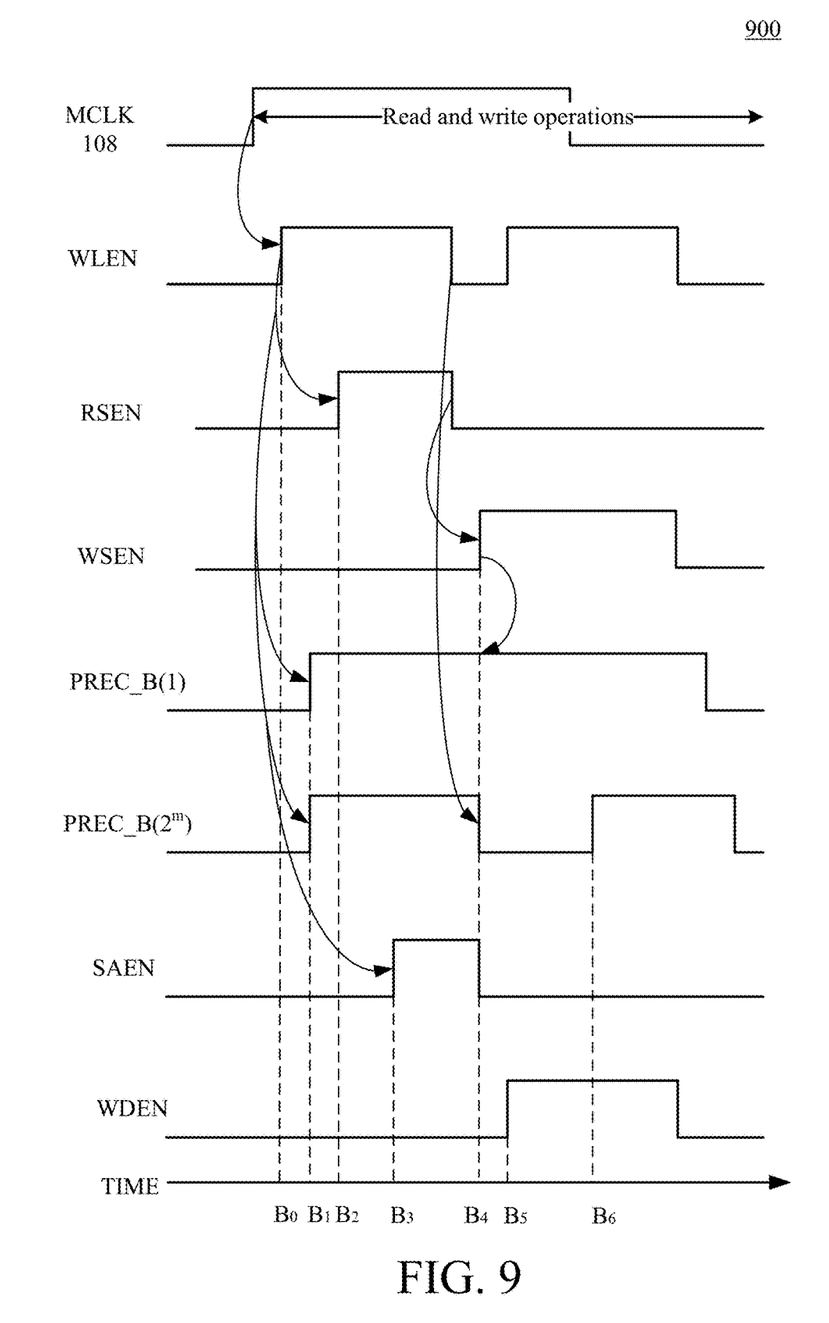
FIG. 9 is a diagram of waveforms of a read operation followed by a write operation utilizing the precharge circuit of FIG. 8.

FIG. 9 is a diagram of waveforms of a read operation followed by a write operation utilizing the precharge circuit of FIG. 8. The diagram 900 illustrates an example of a shortened read operation to write operation transition time. The memory 100 receives the master clock MCLK 108 to initialize the operations. In one implementation, the memory 100 may operate a read operation followed by a write operation within one cycle of the MCLK 108. In the initial state (e.g., before the MCLK 108 is asserted), the WLEN signal is de-asserted (e.g., pulls to low level), and the precharge signals PREC_B is asserted following the WLEN signal. As shown in diagram 900, both the PREC_B(1) and the PREC_B($2^m$) signals are asserted (pulled to low level) to enable the corresponding BLPCs 412 to precharge or pull up the bitline pairs BL and BLB coupled thereto (see FIG. 8). At time $B_0$, the controller 110 asserts the WLEN signal (pulls to high level) in response to the assertion of the MCLK 108. At time $B_1$, in response to the asserted WLEN signal, both the PREC_B(1) and the PREC_B($2^m$) signals are de-asserted (pulled to high level) following the asserted WLEN signal (see, FIG. 8). The BLPC 412(1) and BLPC 412($2^m$) stop precharging the bitline pairs BL and BLB coupled thereon, in response to the de-asserting of the PREC_B(1) and the PREC_B($2^m$) signals.

At time $B_2$, the controller 110 (in response to the assertion of the WLEN signal) asserts the RSEN signal for the read operation by pulling the RSEN signal to high level. The RSEN signal connects the bitline pair GBL and GBLB to the SA 420 (see, FIG. 6). The read operation may follow the assertion of RSEN signal (as presented with FIG. 7). The controller 110 may de-assert the WLEN signal upon a completion of the read operation (e.g., after the SAEN signal is de-asserted).

At time $B_3$, the controller 110 asserts the SAEN signal (e.g., pulls high) to enable the SA 420 to read the data on the bitline pair BL and BLB (see, FIG. 7). The controller 110 may de-assert the SAEN signal upon a completion of the read operation. Thus, in some examples, the asserted SAEN signal denotes the start and the end of a read operation.

At time $B_4$, the controller 110 may, in response to the de-asserted RSEN signal, assert the WSEN signal (e.g., pull to high level). The WSEN signal connects the bitline pair GBL and GBLB to the write driver 430 (see, FIG. 6). Referring to FIG. 8, the column select CS(1) may be asserted in one example. Based on the CS(1) signal, the PREC_B(1) signal is de-asserted (e.g., pulled to low level) by the asserted WSEN signal. The BLPC 412(1) is accordingly disabled by the de-asserted PREC_B(1) signal and does not precharge or pull up the bitline pair BL(1) and BLB(1) coupled thereto. Referring back to FIG. 9, the other PREC_B signals (e.g., PREC_B($2^m$)) are not affected by the column select CS signals, and may be asserted at $B_4$-$B_6$ to enable the corresponding BLPCs 412 to precharge or pull up the bitlines BL and BLB coupled thereto.

Since the bitline pair BL(1) and BLB(1) is not precharged, the write operation may be performed on the bitline pair BL(1) and BLB(1) while the other bitline pairs (e.g., BL($2^m$) and BLB($2^m$)) are being precharged. Referring back to FIG. 9, at time $B_5$, the controller 110 may assert the WDEN signal (e.g., pull to high level) to enable the write driver 430. In such fashion, the write operation is performed at a time period $B_5$-$B_6$ to overlap the precharging operation at a time period $B_4$-$B_6$.

In one aspect, as presented with FIGS. 8 and 9, the memory 100 includes multiple memory cells 300 arranged as $2^m$ columns, the columns being respectively coupled to $2^m$ bitline pairs BL and BLB. Each of the columns of memory cells 300 is coupled to a write driver 430 via a corresponding one of the bitline pairs BL and BLB. A precharge circuit BLPC 412 (e.g., including the BLPC 412(1)-BLPC 412($2^m$) coupled respectively to the bitline pairs BL and BLB) is configured to precharge or pull up each of the bitline pairs BL and BLB before a read operation. For example, the read operation may correspond to asserting the SAEN signal to enable the SAs 420 to read data on the bitline pairs BL and BLB.

Referring to FIG. 9, each of the bitline pairs BL and BLB is precharged in the time period $B_0$-$B_1$ before the read operation (e.g., the SAEN signal being asserted at the time $B_3$). In the time period $B_0$-$B_1$, all the precharge signals (e.g., PREC_B(1)-PREC_B($2^m$)) are asserted to effect the BLPC 412(1)-BLPC 412($2^m$) to precharge the bitline pairs BL and BLB.

Following the read operation (e.g., de-asserting the SAEN signal at the time $B_4$), one of the BLPCs 412 (e.g., the BLPC 412(1)) is prevented from being enabled by the asserted WSEN signal. The WSEN signal may be asserted to indicate a write operation, and the PREC_B(1) signal may be de-asserted in response. The remaining BLPCs 412 (e.g., BLPC 412(2)-BLPC 412(21) may be enable by the corresponding PREC_B signals (e.g., PREC_B(2)-PREC_B($2^m$)) to precharge the bitline pairs BL and BLB coupled thereto. Thus, the collective precharge circuit BLPC 412 precharges all but one of the bitline pairs BL and BLB (e.g., the one coupled to the BLPC 412(1)) following the read operation. Subsequently, the WDEN signal is asserted (e.g., at the time $B_5$) to enable the write driver 430 to drive the bitline pair coupled to the BLPC 412(1) following the read operation.

In another aspect, the precharge circuit BLPC 412 may be configured to precharge all of the bitline pairs BL and BLB coupled thereto for a first operation. For example, the precharge circuit BLPC 412 may be enabled at the time period $B_0$-$B_1$ to precharge all of the bitline pairs BL and BLB for the read operation (e.g., the assertion of the SAEN signal at the time period $B_3$-$B_4$). The precharge circuit BLPC 412 may be further configured to precharge all but one of the bitline pairs BL and BLB (e.g., the bitline pair BL and BLB coupled to the BLPC 412(1) for a second operation. As presented above, the BLPC 412(1) is disabled at the time $B_4$ (by preventing the PREC_B(1) signal from being asserted) for the write operation (e.g., the asserting the WSEN signal and the WDEN signal after the read operation).

The precharge circuit BLPC 412 (e.g., BLPC 412(1)-BLPC 412($2^m$)) is triggered by the trigger signal PREC_B (e.g., PREC_B(1)-PREC_B($2^m$)). The controller 110 is configured to assert the PREC_B signal to precharge each of the bitline pairs BL and BLB before the read operation and to precharge all but one of the bitline pairs BL and BLB (e.g., the bitline pair BL and BLB coupled to the PREC_B(1)

following the read operation). For example, the read operation may correspond to an activation of at least one of the SAs 420 respectively coupled to the bitline pairs BL and BLB (e.g., the SAEN signal being asserted to enable or activate the SAs 420).

The controller 110 may be configured to disable a portion of the precharge circuit BLPC 412 (e.g., to disable the BLPC 412(1) configured to precharge the bitlines BL and BLB coupled thereto) in response to a write signal (e.g., a signal indicating a write operation). For example, referring to FIG. 9, the controller 110 may disable the BLPC 412(1) by preventing the PREC_B(1) signal from being asserted at the time $B_4$, based on the assertion of the WSEN signal. Further, the controller 110 may be configured to disable the portion of the precharge circuit BLPC 412 based on the column address. Referring to FIGS. 4 and 8, the column decoder 406 decodes the column address and outputs the decoded addresses as the CS signals. The controller 110 may disable the portion of the precharge circuit BLPC 412 based on the CS signals.

The memory 100 may further include a switch (e.g., the read/write switcher 440) configured to selectively couple each of the bitline pairs BL and BLB to a corresponding one of SAs 420 and the write driver 430. The controller 110 may be configured to cause the read/write switcher 440 to decouple the bitline pair BL and BLB and the corresponding one of the SAs 420, or to couple the bitline pair BL and BLB to the write driver 430, in response to a write signal (e.g., the WSEN signal or the collective RSEN and WSEN signals). The controller 110 may be further be configured to prevent the PREC_B(1) signal from being asserted (to enable the portion of the BLPC 412 coupled thereto) in response to the read/write switcher 440 coupling the bitline pair BL and BLB to the write driver 430 (e.g., in response to the WSEN being asserted).

In another aspect, the controller 110 is configured such that operations of a portion of the precharge circuit BLPC 412 and the write driver 430 overlap. Referring to FIG. 9, the controller 110 enables the precharge circuits BLPC 412(2)-BLPC 412(2′′′) at the time period $B_4$-$B_6$ (e.g., by asserting the precharge signals PREC_B(2)-PREC_B(2′′′). The controller 110 further enables the write driver 430 at the time $B_5$, by asserting the WDEN signal, to overlap the portion of the precharge circuit BLPC 412 being enabled. The controller 110 is further configured to enable the write driver 430 (by asserting the WDEN signal) in response to the read/write switcher 440 coupling the bitline pair BL and BLB to the write driver 430 (e.g., in response to WSEN signal being asserted).

Figure 10:
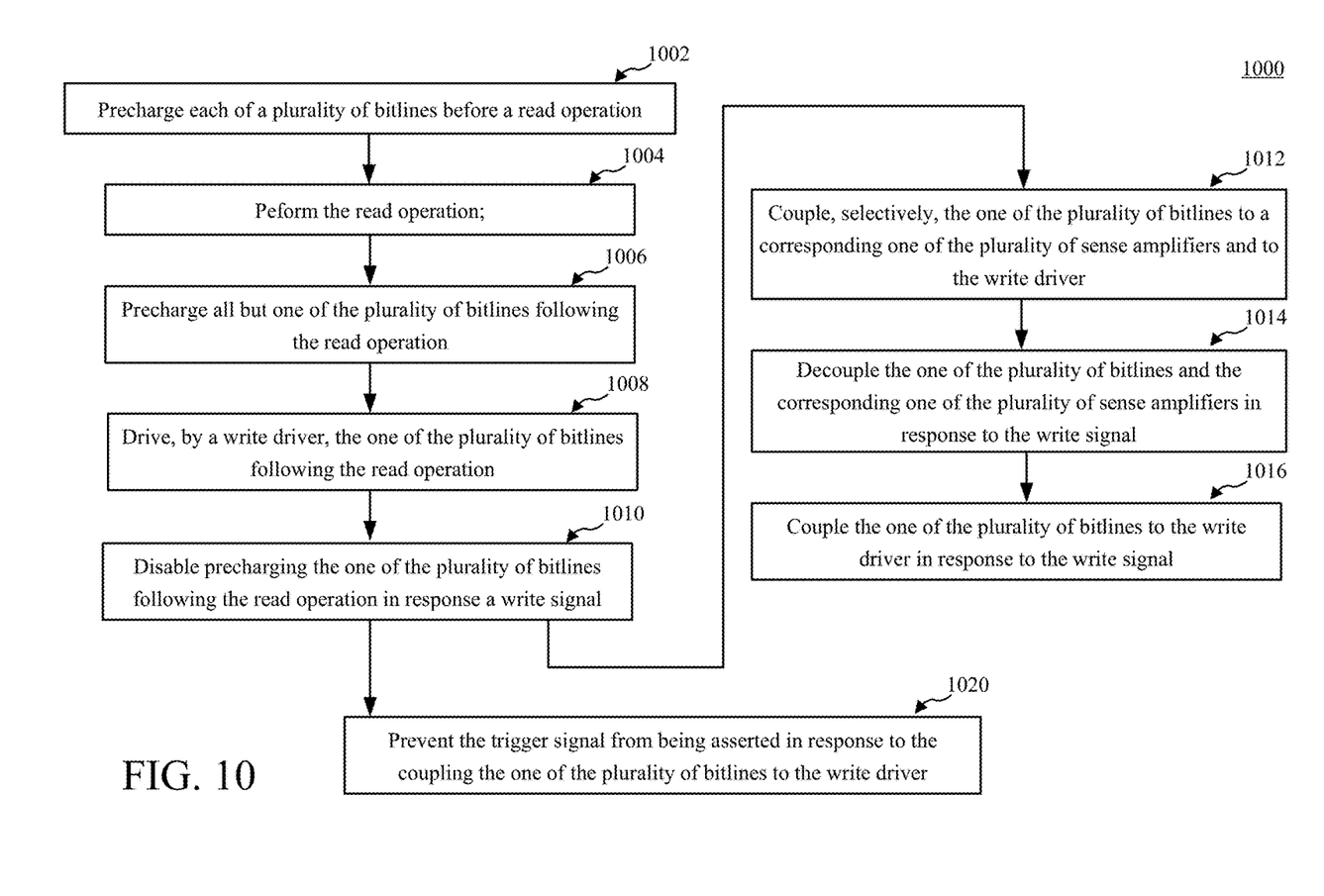
FIG. 10 is a flowchart for operating the embodiment of the memory of FIG. 1

FIG. 10 is a flowchart for operating the exemplary embodiment of the memory of FIG. 1. The flowchart 1000 depicts a method for operating the memory 100 and may be performed by components and/or circuits presented with FIGS. 6 and 8. At 1002, each of a plurality of bitlines is precharged before a read operation. For example, the precharge circuit BLPC 412 (e.g., including the BLPC 412(1)-BLPC 412(2′′′) coupled respectively to the bitline pairs BL and BLB) is configured to precharge or pull up each of the bitline pairs BL and BLB before a read operation. For example, the read operation may correspond to asserting the SAEN signal to enable the SAs 420 to read data on the bitline pairs BL and BLB.

At 1004, the read operation is performed. For example, referring to FIG. 9, the SAEN signal is asserted to enable the SAs 420 to read data on the bitline pairs BL and BLB at the time period $B_3$-$B_4$. At 1006, all but one of the plurality of bitlines are precharged following the read operation. For example, following the read operation (e.g., the de-asserting of the SAEN signal at the time $B_4$), one of the BLPCs 412 (e.g., the BLPC 412(1)) is prevented from being activated by the disabling of the PREC_B(1) signal. The disabling of the PREC_B(1) signal may be based on the WSEN signal being asserted to indicate a write operation, for example. The remaining BLPCs 412 (e.g., BLPC 412(2)-BLPC 412(2′′′)) are enable by the corresponding PREC_B signals (e.g., PREC_B(2)-PREC_B(2′′′)) to precharge the bitline pairs BL and BLB coupled thereto. Thus, the collective precharge circuit BLPC 412 precharges all but one of the bitline pairs BL and BLB (e.g., the one coupled to the BLPC 412(1)) following the read operation.

At 1008, the one of the plurality of bitlines is driven by a write driver following the read operation. Subsequent to the read operation, the WDEN signal is asserted (e.g., at the time $B_5$) to enable the write driver 430 to drive the one bitline pair coupled to the BLPC 412(1) following the read operation. In some examples, the precharge circuit BLPC 412 (e.g., BLPC 412(1)-BLPC 412(2′′′)) is triggered by the trigger signal PREC_B (e.g., PREC_B(1)-PREC_B(2′′′)). The controller 110 may be configured to assert the PREC_B signal to precharge each of the bitline pairs BL and BLB before the read operation and to precharge all but one of the bitline pairs BL and BLB (e.g., the bitline pair BL and BLB coupled to the PREC_B(1) following the read operation). For example, the read operation may correspond to an activation of at least one of the SAs 420 respectively coupled to the bitline pairs BL and BLB (e.g., the SAEN signal being asserted to enable or activate the SAs 420).

At 1010, precharging the one of the plurality of bitlines following the read operation is disabled in response to a write signal. In some example, the controller 110 may be configured to disable a portion of the precharge circuit BLPC 412 (e.g., disable the BLPC 412(1) configured to precharge the bitline BL and BLB coupled thereto) in response to a write signal (e.g., a signal indicating a write operation). For example, referring to FIG. 9, the controller 110 may disable the BLPC 412(1) by preventing the PREC_B(1) signal from being asserted at the time $B_4$, based on the assertion of the WSEN signal. Further, the controller 110 may be configured to disable the portion of the precharge circuit BLPC 412 based on the column address. Referring to FIGS. 4 and 8, the column decoder 406 decodes the column address and outputs the decoded addresses as the CS signals. The controller 110 may disable the portion of the precharge circuit BLPC 412 based on the CS signals.

At 1012, the one of the plurality of bitlines is selectively coupled to a corresponding one of the plurality of sense amplifiers and to the write driver. For example, the memory 100 may include a switch (e.g., the read/write switcher 440) configured to selectively couple each of the bitline pairs BL and BLB to a corresponding one of SAs 420 and the write driver 430. At 1014, the one of the plurality of bitlines and the corresponding one of the plurality of sense amplifiers are decoupled in response to the write signal. At 1016, the one of the plurality of bitlines is coupled to the write driver in response to the write signal. For example, the controller 110 may be configured to cause the read/write switcher 440 to decouple the bitline pair BL and BLB and the corresponding one of the SAs 420, or to couple the bitline pair BL and BLB to the write driver 430, in response to a write signal. The write signal may include the WSEN signal or the collective RSEN and WSEN signal. In some examples, the read/write switcher 440 may be implemented with a single set of switches coupling the bitline pairs BL and BLB to the SAs 420. The collective RSEN and WSEN signal controls the read/write switcher to couple the bitline pairs BL and BLB to the SAs 420, in case of a read operation, and decouple the bitline pairs BL and BLB and the SAs 420, in case of a write operation.

At 1020, the trigger signal is prevented from being asserted in response to the coupling the one of the plurality of bitlines to the write driver. In some examples, 1020 provides an alternate operation to the operations of 1012, 1014, and 1026. For example, the controller 110 may be configured to prevent the PREC_B(1) signal from being asserted (to enable the portion of the BLPC 412 coupled thereto) in response to the read/write switcher 440 coupling the bitline pair BL and BLB to the write driver 430 (e.g., in response to the WSEN being asserted).

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A memory, comprising:
    a plurality of memory cells;
    a plurality of bitlines, each of the plurality of bitlines being coupled to a corresponding one of the plurality of memory cells;
    a precharge circuit configured to precharge all of the plurality of bitlines for a first operation and to precharge all but one of the plurality of bitlines for a second operation.

2. The memory of claim 1, wherein the first operation is a read operation and the second operation is a write operation.

3. The memory of claim 2, wherein the precharge circuit is configured to precharge each of the plurality of bitlines before the read operation and to precharge all but one of the plurality of bitlines following the read operation.

4. The memory of claim 3, further comprising a write driver configured to drive the one of the plurality of bitlines following the read operation.

5. The memory of claim 4, wherein the precharge circuit is triggered by a trigger signal to precharge each of the plurality of bitlines before the read operation and to precharge all but one of the plurality of bitlines following the read operation.

6. The memory of claim 5, wherein the read operation comprises an activation of at least one of a plurality of sense amplifiers respectively coupled to the plurality of bitlines.

7. The memory of claim 6, wherein a portion of the precharge circuit is configured to be disabled in response to a write signal, the portion of the precharge circuit being configured to precharge the one of the plurality of bitlines.

8. The memory of claim 7, wherein the precharge circuit is further configured to be disabled based on an address.

9. The memory of claim 8, further comprising a switch configured to selectively couple the one of the plurality of bitlines to a corresponding one of the plurality of sense amplifiers and to the write driver.

10. The memory of claim 9, wherein the switch is configured to decouple the one of the plurality of bitlines and the corresponding one of the plurality of sense amplifiers or to couple the one of the plurality of bitlines to the write driver, in response to the write signal.

11. The memory of claim 7, wherein the trigger signal is prevented from being asserted in response to the write signal.

12. A method to operate a memory, comprising:
    precharging each of a plurality of bitlines before a read operation, wherein each of the plurality of bitlines is coupled to a corresponding one of a plurality of memory cells;
    performing the read operation;
    precharge all but one of the plurality of bitlines following the read operation; and
    driving, by a write driver, the one of the plurality of bitlines following the read operation.

13. The method of claim 12, wherein the precharging each of the plurality of bitlines before the read operation and the precharging all but one of the plurality of bitlines following the read operation are triggered by a trigger signal.

14. The method of claim 13, wherein the read operation comprises an activation of at least one of a plurality of sense amplifiers respectively coupled to the plurality of bitlines.

15. The method of claim 14, further comprising disabling precharging the one of the plurality of bitlines following the read operation in response to a write signal.

16. The method of claim 15, wherein the disabling precharging the one of the plurality of bitlines following the read operation is further based on an address.

17. The method of claim 16, further comprising coupling, selectively, the one of the plurality of bitlines to a corresponding one of the plurality of sense amplifiers and to the write driver.

18. The method of claim 17, further comprising decoupling the one of the plurality of bitlines and the corresponding one of the plurality of sense amplifiers or coupling the one of the plurality of bitlines to the write driver, in response to the write signal.

19. The method of claim 15, further comprising preventing the trigger signal from being asserted in response to the coupling the one of the plurality of bitlines to the write driver.

20. A memory, comprising:
    a plurality of memory cells;
    a plurality of bitlines, each of the plurality of bitlines being coupled to a corresponding one of the plurality of memory cells;
    a precharge circuit configured to precharge the plurality of bitlines;

a write driver configured to drive the plurality of bitlines; and a controller configured to enable a portion of the precharge circuit and to enable the write driver during an overlapping period of a read followed by a write operation.

21. The memory of claim 20, further comprising a switch configured to selectively couple one of the plurality of bitlines to a corresponding one of a plurality of sense amplifiers and to the write driver.

22. The memory of claim 21, wherein the controller is configured to cause the switch to decouple the one of the plurality of bitlines and the corresponding one of the plurality of sense amplifiers or to couple the one of the plurality of bitlines to the write driver in response a write signal.

23. The memory of claim 22, wherein the controller is further configured to enable the write driver in response to the write signal.

* * * * *